United States Patent [19]

Waldo, III

[11] Patent Number: 4,977,048
[45] Date of Patent: Dec. 11, 1990

[54] ACTINIC ALIGNMENT TO CEM COATED RESIST FILMS

[75] Inventor: Whitson G. Waldo, III, Chandler, Ariz.

[73] Assignee: Motorola, Inc., Schaumburg, Ill.

[21] Appl. No.: 375,560

[22] Filed: Jul. 5, 1989

[51] Int. Cl.$^5$ .............................................. G03F 9/00
[52] U.S. Cl. ..................................... 430/22; 430/311; 430/327
[58] Field of Search ................. 430/22, 311, 327, 273, 430/394; 356/400

[56] References Cited

PUBLICATIONS

Chao et al., "Self-Developing Resists for Direct-View Alignment", IBM Tech. Disc. Bull., vol. 26(11), 1984, pp. 5954–5955.

*Primary Examiner*—Jose G. Dees
*Attorney, Agent, or Firm*—Joe E. Barbee; Stuart T. Langley

[57] ABSTRACT

A method of actinic aligning semiconductor wafers which are coated with a contrast enhancement material is provided, wherein an alignment target formed on a semiconductor substrate which is coated with photoresist and contrast enhancement material is exposed to actinic wavelength light, while protecting active device areas from exposure. The contrast enhancement material over the alignment target is thus bleached so that the underlying alignment target becomes visible to actinic wavelength light. A pattern comprising an alignment pattern and an active device pattern is projected onto the wafer. The now visible alignment target is aligned to the projected alignment pattern with sub-exposure energy actinic light using conventional techniques and an actinic alignment tool, and the active device pattern subsequently exposed at an exposure energy of the actinic wavelength once the alignment is completed.

10 Claims, 2 Drawing Sheets

ACTINIC ALIGNMENT TO CEM COATED RESIST FILMS

BACKGROUND OF THE INVENTION

This invention relates, in general, to photolithography, and more particularly to photolithography using a contrast enhancement material (CEM) on top of photoresist.

As semiconductor device dimensions approach the submicron level, one of the limiting factors for further reduction in size is the ability to photolithographically reproduce submicron dimensions onto a semiconductor substrate. The minimum dimension which can be reproduced by an alignment tool is determined by the tool's abilities to optically reproduce or image a pattern onto the substrate and to align the imaged pattern to a previous pattern on the semiconductor substrate. The former ability allows the system to produce a small image with acceptable line width control, and the latter ability allows minimum clearance between patterns of a multilayer device. As semiconductor devices become more complex the number of layers used increases and the alignment ability, or alignment tolerance, becomes more important.

A pattern is reproduced on a semiconductor substrate by aligning a mask pattern to a previously formed alignment target or key, and then projecting the mask pattern onto a photoresist covered substrate, thereby exposing the photoresist. The mask pattern comprises an alignment pattern, which is used for alignment, and an active device pattern, which is used to form active devices. Photoresist is sensitive to a narrow bandwidth of light called the actinic wavelengths. The photoresist is also sensitive to the intensity and time of exposure to the actinic wavelength light. Photoresist requires exposure to a threshold energy light for imaging to occur, thus a sub-threshold energy will not expose the photoresist. It is undesirable to expose the photoresist during alignment. One method of aligning the mask pattern to the previously formed target pattern comprises using an alignment wavelength other than the actinic wavelengths for the alignment, so that the photoresist is not exposed during the aligning process. In this manner, the projected alignment pattern can be moved many times with respect to the target until proper alignment is achieved. Once the patterns are aligned, the mask pattern is projected onto the substrate using actinic wavelength light, thereby exposing the photoresist. This method of alignment, however, requires two sets of optics since the focal distances are different for the alignment wavelength and the actinic wavelength. Two sets of optics increase the complexity of the photo alignment tool and decrease alignment accuracy of the tool. Another alignment method which has been developed uses a narrow bandwidth of light of the actinic wavelengths, for both alignment and exposure of the projected pattern. In this method the alignment takes place at a lower energy so that the photoresist layer is not exposed during alignment. Once alignment is complete, the mask pattern is transferred by increasing the light energy above the photoresist's exposure energy threshold. Such systems are called actinic alignment systems. These systems offer the advantage of using a single optic system within the tool and allow for improved alignment tolerances as well as reduced cost and complexity of the tool.

Recently, contrast enhancement materials (CEM) have been used for reproducing images having dimensions around and below 0.5 micron to improve line width control. Contrast enhancement materials comprise a dye which is initially opaque to the actinic wavelengths and bleachable by exposure to light of the actinic wavelength. Above a threshold energy CEM is essentially transparent. CEM may also be responsive to wavelengths other than the actinic wavelength. Contrast enhancement material is applied as a thin layer covering a photoresist layer and, once exposed, forms a portable conformal mask which is in direct contact with the photoresist layer, thus greatly improving the ability to define submicron dimensions. While contrast enhancement materials work well with alignment tools which use non-actinic wavelengths for alignment, when actinic alignment is used the existing pattern on the semiconductor wafer can not be easily seen through the opaque CEM and thus alignment is difficult or impossible. Until now, it has been difficult or impossible to use contrast enhancement material with actinic alignment tools.

One solution to this problem has been to remove the contrast enhancement material over the alignment target by laser ablation so that the alignment target could be seen at actinic wavelengths. Since alignment targets are usually distanced from active device patterns, laser ablation could be used to remove the CEM and photoresist over the alignment target without damaging or exposing active device areas. Laser ablation removes both contrast enhancement material and the underlying photoresist thus exposing the surface of the semiconductor substrate. Laser ablation can result in particulates, generated by the vaporization of the CEM and photoresist, which deposit on active device areas of the substrate. It has also been found that by removing the photoresist layer over the alignment targets that light reflected from the substrate, which is used to detect proper alignment, comprises a large amount of standing wave noise and scattered light which reduce alignment accuracy.

Accordingly, it is an object of the present invention to provide a method for photolithographic alignment which realizes both the improved accuracy of an actinic alignment tool and the small dimensions of contrast enhancement material processes.

It is another object of the present invention to provide a method for actinic alignment using contrast enhancement material with improved alignment tolerance.

A further object of the present invention is to provide a method for actinic alignment using contrast enhancement material with a shorter process time.

It is still a further object of the present invention to provide a method for actinic alignment using contrast enhancement material which is defect free.

SUMMARY OF THE INVENTION

The above and other objects and advantages of the present invention are achieved by bleaching a region of an opaque contrast enhancement material which covers an alignment target formed on a semiconductor substrate while protecting the CEM over an active device region from the bleaching. After bleaching, the underlying alignment target becomes visible and a projected alignment pattern is aligned to the alignment target using conventional techniques in an actinic alignment tool. Once aligned, the CEM and photoresist over the active device region is exposed to an active device pattern and developed.

DETAILED DESCRIPTION OF THE DRAWINGS

Figure 1:
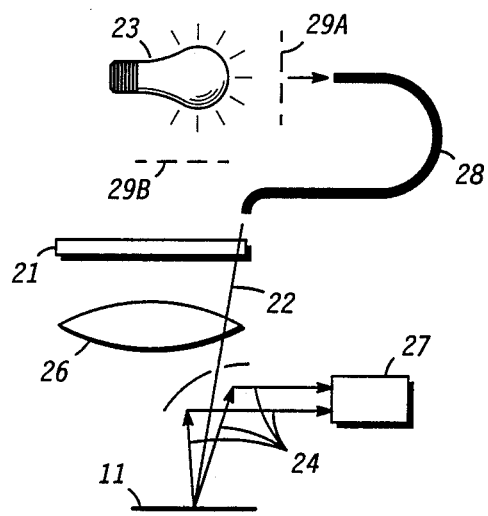
FIG. 1 illustrates in schematic form an actinic alignment tool.

FIG. 1 illustrates a greatly simplified schematic diagram of a photo alignment tool. Features shown in FIG. 1 are common to many stepper alignment sytems, but, as will become apparent, the method of the present invention may be used with a variety of alignment tools. For actinic alignment, light source 23 produces light of the actinic wavelength and is capable of producing at both an exposure energy, which is above a threshold energy of photoresist, and an alignment energy, which is below the threshold energy of photoresist. Light source 23 may comprise several elements which output at various energies or intensities, but are similar in that they output about the same wavelength of light. Commonly, light source 23 comprises a high energy element which is used during exposure, and a low energy element, or a laser, which is used for alignment. Alignment energy light is coupled to mask 21 by light pipe 28, which comprises fiber optic bundles or the like, having a first end which receives light and a second end which projects the light onto mask 21. Shutter 29A gates the light which enters light pipe 28. Shutter 29B gates the light which exposes the mask pattern. Light passes through photo mask 21 to produce a projected pattern illustrated by line 22. The projected pattern 22 passes through lens assembly 26 which projects pattern 22 onto a top surface of substrate 11, such as a semiconductor substrate or the like. Alignment is accomplished by monitoring intensity of reflected light 24 from the top surface of a substrate 11 which passes through lens assembly 26 to photo detector 27. Transfer of an image on mask 21 to substrate 11 is accomplished by increasing the intensity of light source 23 above the threshold energy of a photoresist which is applied to substrate 11, and opening shutter 29B so that mask 21 is fully exposed to light source 23. The details of mask 21 and substrate 11 will be described in greater detail hereinafter.

Figure 2:
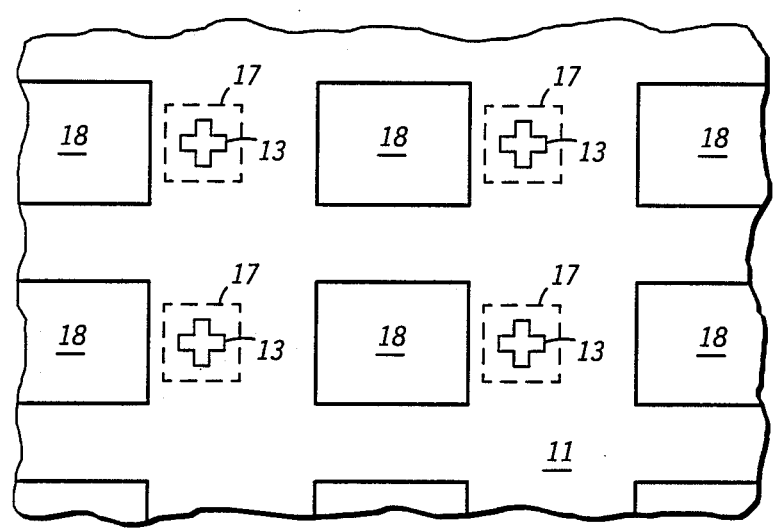
FIG. 2 is a plan view of a portion of a semiconductor substrate partially through processing.

FIG. 2 illustrates a plan view of a portion of a partially processed semiconductor wafer after alignment keys or targets 13 have been formed on the substrate. Active device areas 18 comprise an integrated circuit or other semiconductor device which has been formed in and on substrate 11. Along side each active area 18 there is an alignment area 17 in which alignment key 13 is formed. Active area 18 and alignment area 17 are spaced from each other so that alignment area 17 can be exposed to light while not exposing active device area 18. The spacing between the two areas will be determined by the limitations of an alignment tool used. The surface features of active device area 18 and alignment target 13 have been formed by previous photolithography steps. Usually, a projected pattern from mask 21 is stepped across the surface of the wafer and repeated many times. Typically ten or more layers are used in an integrated circuit, each layer requiring alignment to a previous pattern.

Figure 3:
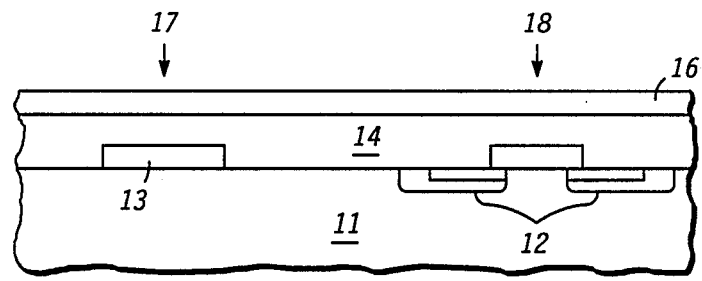
FIGS. 3-5 are cross-sectioned views of a portion of the semiconductor substrate at various stages of a photolithographic process.

FIG. 3 illustrates a cross-sectional view of a portion of a partially processed semiconductor wafer prepared for alignment and exposure of a pattern. Active devices, such as doped impurity regions 12, and alignment target 13 have been formed in and on substrate 11 by previous process steps. It should be understood that alignment target 13 can be formed of an oxide, polysilicon, diffused region, or the like, and may therefore extend above or extend into substrate 11. Substrate 11, including active device region 18 and alignment region 17, are covered with photoresist layer 14 and contrast enhancement material (CEM) layer 16 before alignment. Photoresist layer 14 may be positive or negative photoresist. CEM layer 16 is initially opaque to actinic wavelengths which would expose photoresist layer 14, and is also bleachable at the actinic wavelength when exposed to a threshold energy of light.

The alignment process usually comprises two stages. Referring now to FIGS. 1 and 2, the first stage is a gross alignment which places projected pattern 22 in the general vicinity of alignment target 13, and the second stage is a local alignment which fine tunes the position of projected pattern 22 relative to alignment target 13. The gross alignment step can be performed with non-actinic light since it is a non-critical alignment, or may be performed by registering the location of projected pattern 22 to an edge of substrate 11. Since gross alignment typically does not depend on the reflection of actinic wavelength light from alignment target 13, contrast enhancement layer 16 on the wafer does not interfere with gross alignment. Not all of the alignment targets 13 illustrated in FIG. 2 are used for local alignment. Usually four or more alignment targets in different quadrants across the semiconductor wafer are used for local alignment, and once local alignment is complete the pattern is stepped across the surface of the substrate without further alignment.

Figure 4:
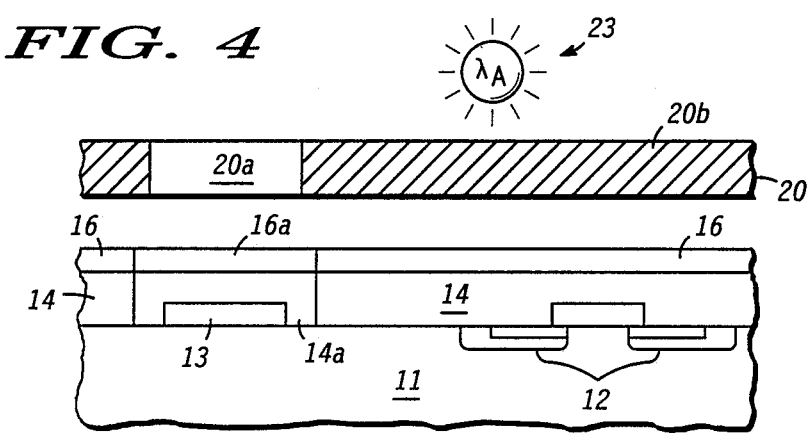

FIG. 4 illustrates the first stage of actinic alignment using the method of the present invention. In a preferred embodiment, photo mask 20 is used to expose alignment area 17 while protecting active device area 18 from exposure. Photo mask 20 comprises opaque region 20b and transparent region 20a, wherein region 20a is large enough that light projected through region 20a surrounds alignment target 13 and can be aligned to alignment target 13 during the gross alignment step. Mask 20 is shown in proximity with substrate 11 for ease of description, but usually a pattern from mask 20 is projected onto substrate 11 using the apparatus of FIG. 1. The projected pattern may be generated by a projection photo-alignment tool, contact photo-alignment tool, proximity printer, or the like. Alternatively, contrast enhancement material layer 16 can be exposed over alignment area 17 only without the use of photo mask 20 if the photo alignment tool is capable of masking portions of the substrate using framing blades (not shown).

Figure 5:
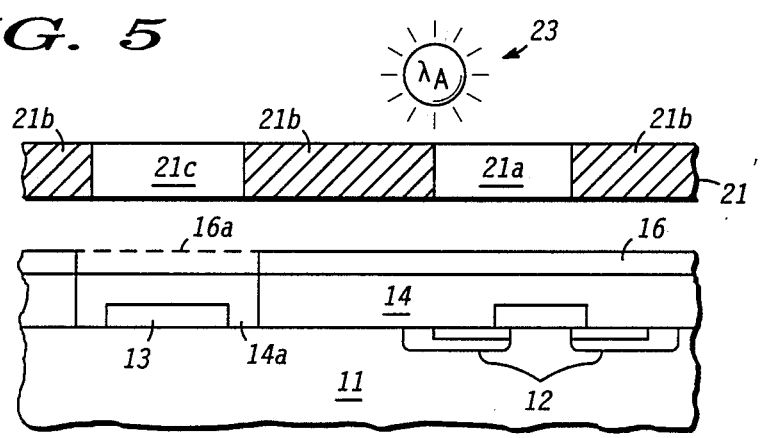

After exposure to actinic wavelength light, region 16a of CEM layer 16 is transparent to the actinic wavelength and actinic alignment can be performed as shown in FIG. 5. If CEM layer 16 is responsive to wavelengths other than the actinic wavelength, the other wavelengths can also be used to bleach region 16a. Photomask 20 is replaced by photomask 21, which comprises opaque regions 21b, transparent regions 21a, and transparent alignment pattern 21c. Transparent region 20a may be incorporated onto mask 21, in which case a single mask 21 may be used for both the bleaching step and the exposure step described hereinafter. Local alignment is performed using actinic wavelength light at an energy below the threshold energy of the CEM, so that the CEM remains opaque over active area 18 during local alignment. Photo mask 21 is placed between the actinic wavelength light source and the semiconductor device so as to produce the projected pattern which is aligned to alignment target 13. Transparent region 21a projects an active device pattern onto active device area 18, and transparent region 21c projects an alignment pattern onto alignment area 17. Substrate 11 and/or mask 21 are moved in relation to each other until the projected pattern from alignment pattern 21c is aligned properly to alignment target 13. Reflected light from alignment region 17 travels through transparent CEM region 16a and is analyzed to determine when proper alignment is provided. Transparent CEM region 16a and Exposed photoresist region 14a in alignment area 17 serves to absorb some of the standing wave noise and scattered light which would otherwise be transmitted with the reflected light, thus improving the accuracy of the alignment. After the alignment step is complete, energy level of actinic light is increased above the threshold energy of contrast enhancement material 16 to bleach portions of CEM layer 16 and expose portions of photoresist layer 14 in active device region 18. After exposure, CEM layer 16 is removed and photoresist layer 14 is developed using conventional methods and the photoresist alignment process is complete.

By now it should be appreciated that an improved method of actinic alignment using opaque contrast enhancement material has been provided wherein contrast enhancement material over an alignment target is bleached prior to local alignment, thereby making the alignment target visible. Once the alignment target is visible, local alignment using actinic wavelength light is performed. Because the CEM over the alignment target is bleached, actinic wavelength light can be transmitted through the CEM for alignment purposes at low energy so that the CEM over an active device region remains opaque. Thus, advantages of an actinic alignment tool and advantages of contrast enhancement material are achieved simultaneously, allowing fine line definition and submicron alignment accuracy without increasing defectivity of the semiconductor device.

I claim:

1. A method for alignment of a pattern projected onto a semiconductor wafer to an alignment target, the semiconductor wafer being coated with photoresist which is sensitive to a characteristic actinic wavelength, and the photoresist being coated with an initially opaque contrast enhancement material (CEM) which is bleachable at the actinic wavelength, the alignment target formed in a first area of the wafer and an active device formed in a second area of the wafer, the method comprising the steps of: exposing the CEM and photoresist over the first area of the wafer to light while protecting the second portion of the wafer from exposure, thereby making the CEM transparent over the alignment target; and aligning the projected pattern to the alignment target using the actinic wavelength of light.

2. The method of claim 1 wherein the photoresist is a positive photoresist.

3. The method of claim 1 wherein the photoresist is a negative photoresist.

4. The method of claim 1 wherein the projected pattern is produced by a projection photo-alignment tool.

5. The method of claim 1 wherein the projected pattern is produced by a contact photo-alignment tool.

6. The method of claim 1 wherein the projected pattern is produced by a proximity photo-alignment tool.

7. The method of claim 1 wherein the alignment is performed at a light energy level, which is lower than the bleaching threshold energy level of the CEM.

8. The method of claim 1 wherein the CEM and photoresist over the first area of the wafer are exposed to actinic wavelength light.

9. The method of claim 1 wherein the CEM is bleachable by exposure to non-actinic wavelength light, and the step of exposing the CEM and photoresist over the first area of the wafer is performed with non-actinic wavelength light.

10. A method for alignment and exposure of a pattern projected onto a semiconductor wafer having an active device area and an alignment area using approximately monochromatic light comprising the steps of: forming an alignment target in the alignment area; providing a photoresist layer on the wafer; providing an opaque CEM layer on the photoresist which is bleachable at an actinic wavelength of the photoresist; exposing only the alignment area of the wafer to the actinic light, thereby bleaching the CEM over the alignment area; projecting the pattern onto the wafer using the actinic wavelength at a low energy level; aligning the pattern to the alignment target; and exposing the CEM and underlying photoresist in the active device area by projecting the aligned pattern onto the wafer with the actinic wavelength at a high energy level.

* * * * *